United States Patent [19]

Porrot et al.

[11] Patent Number: 4,506,333
[45] Date of Patent: Mar. 19, 1985

[54] DEVICE FOR MEASURING THE PHASE ANGLE BETWEEN A SINE WAVE SIGNAL AND A CYCLIC LOGIC SIGNAL OF THE SAME FREQUENCY

[75] Inventors: Pascal Porrot; Daniel Rougeolle, both of Paris, France

[73] Assignee: Thomson-CSF, Paris, France

[21] Appl. No.: 400,490

[22] Filed: Jul. 21, 1982

[30] Foreign Application Priority Data

Jul. 24, 1981 [FR] France ............................. 81 14420

[51] Int. Cl.³ .................... G06F 15/31; G06G 7/22
[52] U.S. Cl. ................................ 364/487; 324/83 R; 340/347 SY; 364/484
[58] Field of Search ............... 364/480, 483, 484, 487; 340/347 SY, 347 AD; 324/83 R, 83 D, 85

[56] References Cited

U.S. PATENT DOCUMENTS

| | | |
|---|---|---|
| 3,602,812 | 8/1971 | Paradise . |
| 3,766,545 | 10/1973 | Hikosaka ..................... 340/347 AD |
| 3,829,854 | 8/1974 | Brand et al. ................. 340/347 AD |
| 3,978,287 | 8/1976 | Fletcher et al. .................. 364/513.5 |
| 4,075,698 | 2/1978 | Lode . |

FOREIGN PATENT DOCUMENTS 2008842 1/1970 France .
2086722 12/1971 France .

Primary Examiner—James D. Thomas
Assistant Examiner—Dale M. Shaw
Attorney, Agent, or Firm—Oblon, Fisher, Spivak, McClelland & Maier

[57] ABSTRACT

According to the invention, on the basis of a logic signal of frequency F a multiplier processes a signal of frequency 4F sampling a A/D converter, which supplies at its outputs the digital values and a bit representing the sign of $\sin \phi$ and $\cos \phi$. These values, processed by a circuit, are restored by two registers, which supply the absolute values of $A \sin \phi$ and $A \cos \phi$. These values are compared in a comparator and as a function of the ratio $|\sin \phi|/|\cos \phi|$ an inverting PROM and a multiplier calculate either $|\tan \phi|$ or $|\cot \phi|$. The phase angle $\phi$ is extracted by a PROM knowing $|\tan \phi|$ or $|\cot \phi|$ and the sine and cosine signs.

4 Claims, 6 Drawing Figures

DEVICE FOR MEASURING THE PHASE ANGLE BETWEEN A SINE WAVE SIGNAL AND A CYCLIC LOGIC SIGNAL OF THE SAME FREQUENCY

BACKGROUND OF THE INVENTION

The invention relates to a device for measuring the phase angle between a sine wave or sinusoidal signal and a periodic or cyclic logic signal of the same frequency as the sine wave signal. It is applicable to synchronizer systems and more specifically to systems for controlling the synchronization of television lines in magnetoscopes.

In known devices, the phase angle, i.e. the displacement angle between two waves of the same frequency, is measured in an analog manner, which is less accurate than the device according to the invention which is based on a digital process. For example, the device according to the invention achieves an accuracy in the measurement of the phase angle such that a clock of above 1 GHz would be necessary in the case of a known device to obtain the same accuracy. Such measuring systems are not at present widely used. Through digitizing the measurements on the sine wave signal, it is possible to relatively easily obtain a very high degree of precision in the device according to the invention.

Fundamentally, the device according to the invention converts the sine wave signal at frequency F into a digital signal by means of an analog-digital converter sampled by the logic signal with which the phase angle is to be measured, said logic signal having a sampling frequency equal to 4 times that of the sine wave signal F. Two samples are measured on each sinusoidal half-cycle, the first sample giving a value representing the sine of the phase angle $\emptyset$ and the second sample giving a value representing the cosine of the phase angle $\emptyset$, displaced by $\pi/2$ and on the basis of which angle $\emptyset$ can easily be calculated.

One of the original features of the device according to the invention is that the measurement of the angle $\emptyset$ is independent of the amplitude of the sine wave signal, because the device either measures the tangent or the cotangent of angle $\emptyset$ in absolute values, thus eliminating the amplitude A of the sine wave signal. Thus, the calculation of the tangent or cotangent of the angle $\emptyset$, whilst forming the ratio of the sine to the cosine or vice versa, means that it is only necessary to take account of those parts in which the tangent or cotangent are linear functions. For this reason, the device according to the invention measures the absolute values of the sine and cosine of the angle and, as a function of the ratio obtained, it calculates either the tangent or the cotangent in such a way that it only works in the linear parts of these functions. Another original aspect of the device is that the precision obtained is only dependent on the number of bits of the analog-digital converter.

BRIEF SUMMARY OF THE INVENTION

More specifically, the present invention relates to a device for measuring the phase angle between a sine wave signal and a cyclic logic signal of the same frequency with, on the input of the sine wave signal, an analog-digital sampling converter, wherein it comprises:

- a frequency multiplying circuit, which transforms the cyclic logic signal of frequency F into a cyclic logic signal of frequency 4F for the purpose of sampling the A-D converter at a rate of 2 samples per half-cycle of the sine wave signal, said samples being representative of sin $\emptyset$ and cos $\emptyset$, displaced by $\pi/2$;
- a circuit for extracting from the sample supplied by the A-D converter absolute values of A sin $\emptyset$ and A cos $\emptyset$, A being the amplitude of the sine wave signal, as well as the signs of sin $\emptyset$ and cos $\emptyset$;
- a circuit for calculating the absolute value of tan $\emptyset$ or cot $\emptyset$ on the basis of the absolute value of A sin $\emptyset$ and A cos $\emptyset$, as a function of whether A sin $\emptyset <$ A cos $\emptyset$ or A sin $\emptyset >$ A cos $\emptyset$, with the elimination of the amplitude A;
- an accumulator which stores a plurality of data tan $\emptyset$ or cot $\emptyset$ and restores a mean value therefrom;
- a programmable read only memory receiving on its inputs digital data representing tan $\emptyset$ or cot $\emptyset$, from the operation performed either in tan $\emptyset$ or cot $\emptyset$, of the sign of cos $\emptyset$ and the sign of sin $\emptyset$, and which supplies at its outputs digital information representing the phase angle $\emptyset$.

BRIEF DESCRIPTION OF THE DRAWINGS

The invention will be described in greater detail hereinafter relative to non-limitative embodiments and the attached drawings, wherein show.

DETAILED DESCRIPTION OF THE PREFERRED EMBODIMENTS

Figure 1:
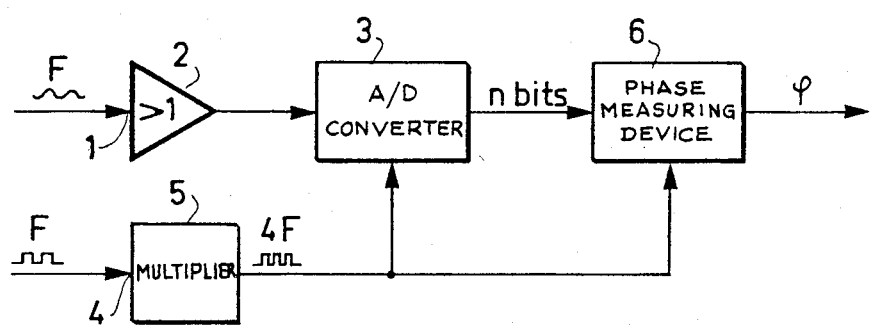
FIG. 1 a block diagram of the phase angle measuring device according to the invention.

FIG. 1 is a highly simplified block diagram of the phase angle measuring device according to the invention. A sine wave signal of frequency F applied to the input terminal 1 of an amplifier 2 is transmitted to an analog-digital converter 3 with n conversion bits. In parallel, a square wave logic signal of the same frequency F as the sine wave signal is applied to the input terminal 4 of a frequency multiplier by four 5, which thus supplies a logic signal of frequency 4F used for sampling the analog-digital converter 3. The output signal of the n bit analog-digital converter is applied to a phase measuring device 6 controlled by the same signal of frequency 4F as that sampled by converter 3.

Measuring device 6 supplies information relative to the phase angle $\emptyset$, which will be defined hereinafter. Fundamentally, the measurement of the phase angle $\emptyset$ involves the measurement of the sine and cosine of angle $\emptyset$, as is shown in FIG. 2.

Figure 2:
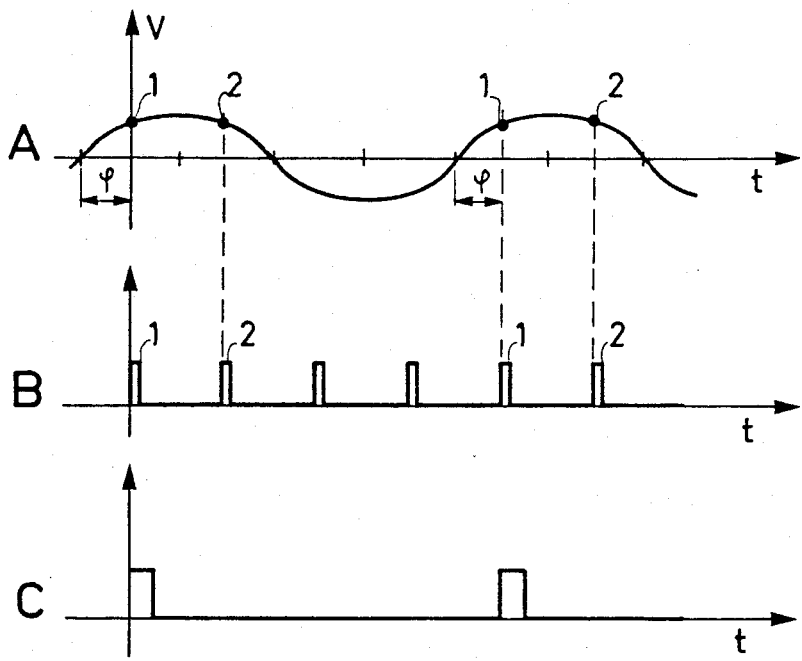
FIG. 2 curves representing the sine wave signal and the logic sampling signal.

FIG. 2 shows the sine wave signal on curve A and the reference signal of the same frequency F on curve C. Curve B represents the sampling signal obtained at the output of multiplier 5 in FIG. 1 at frequency 4F. Thus, four square wave sampling signals correspond to one cycle of the sine wave signal, or two signals per half-cycle, said two signals used for each half-wave being designated 1 and 2.

The phase displacement between the sine wave signal and the logic signal is represented on curve A by distance $\emptyset$, which represents the displacement between the sine wave 0 and the logic zero of curve C. The sine of the phase displacement angle ∅ is measured by the number of bits obtained at the output of the analog-digital converter sampled by the pulse of index 1. The cosine of this angle is measured, under same conditions, by the sample of index 2, displaced by $\pi/2$. The measurement of the sine and cosine of the phase angle ∅ enables the calculation of the phase displacement in the range of $\pm\pi$.

As the sine wave signal is of form:

$$v(t) = A \sin(2\pi Ft + \emptyset)$$

the value obtained corresponding to the sample of index 1 represents A sin ∅ and the value obtained corresponding to the sample of index 2 represents A cos ∅.

To obtain independence of the amplitude A of the sine wave signal, it is merely necessary to form the ratio A sin ∅/A cos ∅, which give tan ∅, or the ratio A cos ∅/A sin ∅, which gives cot ∅.

Figure 3:
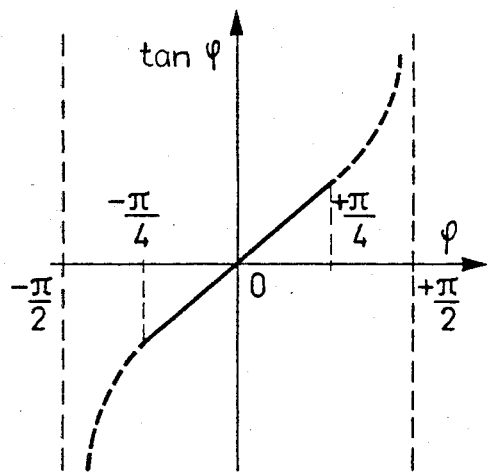
FIGS. 3 and 4 the useful working areas on the curves of tangents $\emptyset$ and cotangents $\emptyset$.
Figure 4:
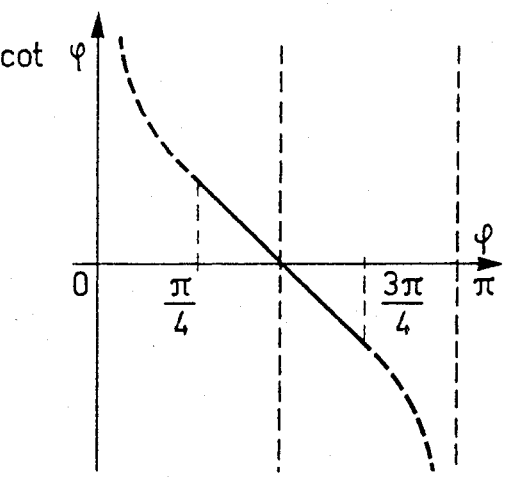

Thus, as shown in FIGS. 3 and 4, only part of the curves representing tan ∅ and cot ∅ can be used for accurately measuring the angle ∅.

FIG. 3 shows the curve of tan ∅ as a function of the angle and it is pointed out that only that part of the curve corresponding to a range between $-\pi/4$ and $+\pi/4$ can be likened to a straight line. In FIG. 4, which shows cot ∅ as a function of the angle ∅, it is pointed out that in the same way only the range between $\pi/4$ and $3\pi/4$ can be likened to a straight line. These areas corresponding to ranges of $\pi/2$ on the measuring range of the device which is + or $-\pi$, so that the device will calculate, as a function of the phase angle, either a tangent or a cotangent. Thus, for a phase angle between $\pi$ and $-(3\pi/4)$, $-(\pi/4)$ and $(3\pi/4)$ and $+\pi$ the device calculates tg ∅ and for a phase angle between $-(3\pi/4)$ and $-(\pi/4)$ and $+(\pi/4)$ and $(3\pi/4)$, the device calculates cotg ∅.

The decision to calculate either the tangent or the cotangent is made by a comparator, which compares the absolute values of A sin ∅ and A cos ∅, so that if the absolute value $|A \sin \emptyset| < |A \cos \emptyset|$, the device calculates the tangent of angle ∅. while if the absolute value of $|A \sin \emptyset| > |A \cos \emptyset|$, the device calculates the cotangent of angle ∅.

The values of tan ∅ or cot ∅ are calculated in absolute values, on the basis of the absolute values of A sin ∅ and A cos ∅, on a range Δ∅ of $\pm\pi/4$, which subdivides the measuring system into 8 zones.

| Angles | 0 | $\pi/4$ | $\pi/2$ | $3\pi/4$ | $\pi$ | $5\pi/4$ | $3\pi/2$ | $7\pi/4$ | $2\pi$ |
|---|---|---|---|---|---|---|---|---|---|
| Zones | 1 | 2 | 3 | 4 | 5 | 6 | 7 | 8 | |
| Sine signs | + | + | + | + | − | − | − | − | |
| Cosine signs | + | + | − | − | − | − | + | + | |
| Calculation of tg | Yes | | | Yes | Yes | | | Yes | |
| Calculation of cotg | | Yes | Yes | | | Yes | Yes | | |

It is possible to unambiguously determine the angle ∅ in a range of $\pm\pi$ through the knowledge of the absolute values of tan ∅ or cot ∅, as a function of the zone corresponding to the phase displacement angle ∅, as well as that of the signs of sin ∅ and cos ∅.

The following drawings provide a better understanding of the way in which the signs and the absolute values of the sine and cosine, tangent and cotangent are measured.

Figure 5:
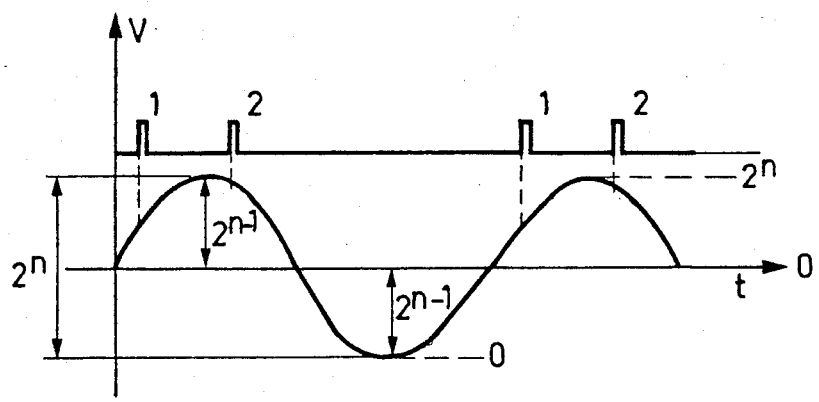
FIG. 5 a diagram illustrating the extraction by an analog-digital converter of the sine $\emptyset$ and cosine $\emptyset$ data.

FIG. 5 shows a diagram illustrating the extraction by an analog-digital converter of data representing sin ∅ and cos ∅. Above the curve representing slightly more than one cycle of the sine wave signal has been plotted the logic sampling signal with a certain phase displacement compared with the sine wave signal. The latter is broken down into two $2^n$ digital values or levels between 0 and $2^n$, the analog 0 being at level $2^{n-1}$ and the amplitude of the signal being within the $2^n$ digital levels.

Thus, the negative half of the wave is measured by $2^{n-1}$ digital levels and the positive half of the wave is measured by $2^{n-1}$ digital levels. By using a 9 bit converter, i.e. $2^9 = 512$ levels, the 0 of the sine curve is located at value 256, while the negative peak is at level 0 and the positive peak is at level 511. The 9 bits of the converter are used in two groups, the most significant bit $2^8$ representing the sign of the sample and the other bits from $2^0$ to $2^7$ represents the digital value of the sample. Thus, the sine wave signal is broken down by a 9 bit analog-digital converter into the digital values given in the following table in absolute terms.

| Digital values | sign bit $2^8$ | Converter outputs (bits representing the analog value) | | | | | | | |
|---|---|---|---|---|---|---|---|---|---|
| | | $2^7$ | $2^6$ | $2^5$ | $2^4$ | $2^3$ | $2^2$ | $2^1$ | $2^0$ |
| 511 | 1 | 1 | 1 | 1 | 1 | 1 | 1 | 1 | 1 |
| 510 | 1 | 1 | 1 | 1 | 1 | 1 | 1 | 1 | 0 |
| ... | | | | | ... | | | | |
| 258 | 1 | 0 | 0 | 0 | 0 | 0 | 0 | 1 | 0 |
| 257 | 1 | 0 | 0 | 0 | 0 | 0 | 0 | 0 | 1 |
| 256 (analog zero) | 1 | 0 | 0 | 0 | 0 | 0 | 0 | 0 | 0 |
| 255 | 0 | 1 | 1 | 1 | 1 | 1 | 1 | 1 | 1 |
| 254 | 0 | 1 | 1 | 1 | 1 | 1 | 1 | 1 | 0 |
| ... | | | | | ... | | | | |
| 1 | 0 | 0 | 0 | 0 | 0 | 0 | 0 | 0 | 1 |
| 0 | 0 | 0 | 0 | 0 | 0 | 0 | 0 | 0 | 0 |

Two cases occurs.

For measurements of samples having digital values equal to or above 256, i.e. for measurements of the positive half-cycles of the sine wave signal for which the sign bit is equal to 1, the bits $2^0$ to $2^7$ directly represent the analog value. Thus, on the above table, the lines above those of the analog zero for which the sign bit is equal to 1 directly represent the analog value of a positive half-cycle of the sine wave signal.

For measurements on samples of digital values below 256, which correspond to negative half-cycles of the sine wave signal and for which the sign bit is equal to zero, the bits $2^0$ to $2^7$ no longer directly represent the analog value. Thus, the latter are twos complement. In this second case, for obtaining digital values between 0 and 256, i.e. 0 to 256 equals one sign bit $2^8 = 0$, it is necessary to perform the twos complement operation, which leads to the following digital representation.

| Digital values | sign bit $2^8$ | Converter outputs (bits representing the analog value) | | | | | | | |
|---|---|---|---|---|---|---|---|---|---|
| | | $2^7$ | $2^6$ | $2^5$ | $2^4$ | $2^3$ | $2^2$ | $2^1$ | $2^0$ |
| 511 | 1 | 1 | 1 | 1 | 1 | 1 | 1 | 1 | 1 |
| 510 | 1 | 1 | 1 | 1 | 1 | 1 | 1 | 1 | 0 |
| ... | | | | | ... | | | | |
| 258 | 1 | 0 | 0 | 0 | 0 | 0 | 0 | 1 | 0 |
| 257 | 1 | 0 | 0 | 0 | 0 | 0 | 0 | 0 | 1 |
| 256 (analog zero) | 1 | 0 | 0 | 0 | 0 | 0 | 0 | 0 | 0 |

| Digital values | sign bit $2^8$ | Converter outputs (bits representing the analog value) | | | | | | | |
|---|---|---|---|---|---|---|---|---|---|
| | | $2^7$ | $2^6$ | $2^5$ | $2^4$ | $2^3$ | $2^2$ | $2^1$ | $2^0$ |
| 255 | 0 | 0 | 0 | 0 | 0 | 0 | 0 | 0 | 1 |
| 254 | 0 | 0 | 0 | 0 | 0 | 0 | 0 | 1 | 0 |
| ... | ... | | | | ... | | | | |
| 1 | 0 | 1 | 1 | 1 | 1 | 1 | 1 | 1 | 1 |
| 0 | 0 | 1 | 1 | 1 | 1 | 1 | 1 | 1 | 1 |

Thus, the twos complement operation of bits $2^0$ to $2^7$ is controlled by the sign bit $2^8$.

Figure 6:
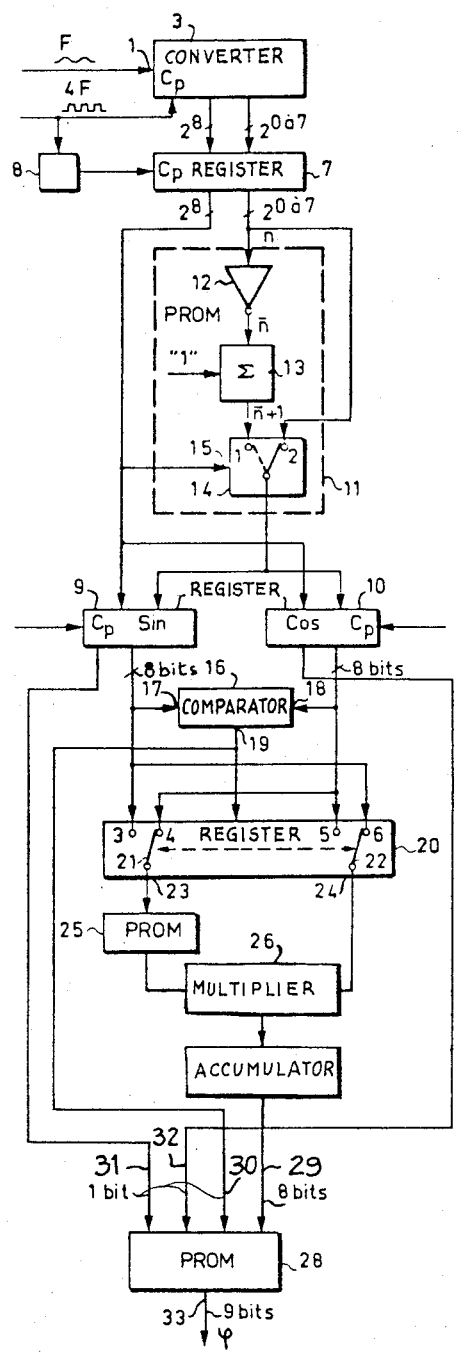
FIG. 6 a block diagram of the device according to the invention.

FIG. 6 shows the diagram of the device according to the invention. The sine wave signal of frequency F is applied, in the manner described hereinbefore, to the input terminal 1 of an analog-digital converter 3. The latter is controlled by a digital signal of frequency 4F and addressed at its clock gate $C_p$. The output levels of the converter, i.e. sign bit $2^8$ of the bits of values $2^0$ to $2^7$ are applied to a register 7, which is controlled by a circuit 8 which, on the basis of the logic signal of frequency 4F, extracts the clock signals corresponding to the samples of indices 1 and 2 in FIG. 2.

At the output terminals of register 7, sine bit $2^8$ is directly applied to the corresponding inputs of two other registers 9 and 10. The bits of digital values $2^0$ to $2^7$, i.e. n digital values are also applied to a twos complement circuit, shown within the dotted line 11 in FIG. 6. This circuit receives the digital value n from register 7 at an inverting amplifier. The output value $\bar{n}$ from inverter 12 is addressed to a first gate of an adder 13, which also receives at a second gate a digital value "1". The output value $\bar{n}+1$, which is the twos complement necessary for calculating the phase angles corresponding to the negative cycles of the sine wave signal, is addressed to a first terminal 1 of a switch 14. At a second terminal 2, the switch 14 receives the signal n directly sampled at the output of register 7. Finally, by means of a terminal 15, switch 14 is controlled by sign bit $2^8$, whose significance is 0 or 1, as a function of the phase displacement angle. The signal transmitted to the output of the switch as a function of the sign bit value is indicated below:

| sign bit $2^8$ | 0 | 1 |
|---|---|---|
| switch position | switching step 1 | switching step 2 |
| value transferred by switch | $\bar{n}+1$ | n |

The signal transmitted by switch 14 is addressed in parallel to the two aforementioned registers 9 and 10 controlled at their clock gates by the sine and cosine sampling signals respectively, register 9 being used for sine recording and register 10 for cosine recording.

At the output terminals of register 9 are available on the one hand sine sign information, directly from the information of sign bit $2^8$, and on the other hand 8 bits giving the absolute value of A sin ∅. In the same way, at the output terminals of register 10, there are on the one hand the cosine sign and on the other the absolute value of A cos ∅ on 8 bits.

These absolute values and the sine and cosine signs make it possible to process data of absolute values tan ∅ or cot ∅. The decision criterion for the device to use either the tangent or the cotangent results from the comparison between the absolute sine and cosine values, as indicated hereinbefore. If |A sin ∅| is below |A cos ∅|, the device calculates the tangent. In the opposite case, the device calculates the cotangent. Switching takes place automatically on the basis of the result of a digital comparator.

The circuit for processing the absolute values of tan ∅ or cot ∅ comprises a comparator 16 receiving on its two input terminals 17 and 18 the data from registers 9 and 10, i.e. it receives an its input terminal 17 a |A sin ∅| and at its terminal 18 |A sin ∅|. Simultaneously, the input data from comparator 16 and transmitted to two switches 21, 22. The information |A sin ∅| present on input terminal 17 of comparator 16 is transmitted to a first terminal 3 of a first switch 21 and to a second terminal 6 of a second switch 22, whilst information |A cos ∅| present on the input terminal 18 of the comparator is transmitted to a second terminal 4 of the first switch 21 and to a first terminal 5 of a second switch 22. Switches 21 and 22 are represented by the symbolic diagram of an electromechanical switch. In fact, they form part of register 20, which is a flip-flop register with 8 bit, 3 state outputs and which in fact function like a series of switches.

The output signal of comparator 16, sampled at terminal 19 corresponds to the comparison between the absolute values of the sine and the cosine and consequently to the operation decision of the device by calculating then either the tangent or the cotangent of the phase angle. This output signal on terminal 19 is consequently addressed to register 20 and it controls switches 21 and 22. If the switches are in the position corresponding to their first terminal 3 or 5, the device calculates cot ∅. However, if the switches are as shown in FIG. 6 in the position corresponding to their second terminal 4 and 6, the device calculates the tan of the phase angle.

Thus, the decision to either calculate tan ∅, or cot ∅ results from the comparison of the absolute values of A sin ∅ and A cos ∅, the signal representing this comparison and coming from terminal 19 of comparator 16 orienting either A sin ∅ on output terminal 23 of switch 21 and simultaneously A cos ∅ on output terminal 24 of switch 22, or conversely A cos ∅ on output terminal 23 of switch 21 and A sin ∅ on output terminal 24 of switch 22.

This branching of the values of A sin ∅ and A cos ∅ is made necessary by the fact that tan ∅ and cot ∅ are not calculated by forming the ratio A sin ∅/A cos ∅ or vice versa, but instead use a digital multiplier, i.e.:

$$|\tan \phi| = |A \sin \phi| \cdot \frac{1}{|A \cos \phi|}$$

$$|\cot \phi| = |A \cos \phi| \cdot \frac{1}{|A \sin \phi|}$$

The reciprocal of the functions A sin ∅ or A cos ∅ is obtained by means of a programmable read-only memory PROM 25 positioned on the electrical path of one of the two outputs, such as e.g. switch 21 in FIG. 6. This memory is programmed in such a way that it restores the reciprocal of the value addressed to it.

The signals from a first switch 21, followed by the inverting PROM 25 and a second switch 22 are both addressed to a multiplier 26, which therefore carries out the multiplication in accordance with one of the two equations given hereinbefore. If switches 21 and 23 are at the positions corresponding to their terminals 3 and 4, multiplier 26 performs the multiplication (1/|A sin ∅|) (|A cos ∅|). If switches 21 and 22 are on the positions corresponding to their terminals 4 and 6, multiplier 26 performs the multiplication $(1/|A \cos \emptyset|)(|A \sin \emptyset|)$.

The output signal of multiplier 26, which is therefore the digital value of tan $\emptyset$ or cot $\emptyset$, is addressed to an accumulator 27, which forms the mean value of several values of tan $\emptyset$ and cot $\emptyset$, in order to improve the signal-to-noise ratio of the output value.

The different values of tan $\emptyset$ or cot $\emptyset$, sine and cosine signs and calculation decision data either by tan or by cot processed hitherto in the circuit according to the invention makes it possible to calculate the angle $\emptyset$.

The calculation is performed by a programmable read-only memory PROM 28, which receives at its inputs 29 the information on 8 bits of tan $\emptyset$ or cot $\emptyset$ from accumulator 27, while receiving at its input 30 the information on one calculation decision bit either in tan or in cot and which comes from the output terminal 19 of comparator 16. Finally, it receives at its two inputs 31, 32 on one bit the sine $\emptyset$ and cosine $\emptyset$ sign data. Thus, it is possible to unambiguously calculate the angle $\emptyset$, whose digital value is restored on 9 bits on output terminal 33 of PROM 28.

The device for firstly measuring the phase angle between two signals, namely a sine wave signal and a cyclic logic signal of the same frequency as the sine wave signal, can in particular be used in the synchronization of the scanning of the lines in a magnetoscope. This device makes it possible to correct errors in the run linked with tape speed errors, to the extension or compression of the tape as a result of temperature, moisture or for any other reason. However, this device can be used more generally for the synchronization of the system in which a sine wave signal has to be defined in time with respect to logic square wave pulses or the like.

What is claimed is:

1. A device for measuring the phase angle between a sine wave signal and a cyclic logic signal of the same frequency with, on the input of the sine wave signal, an analog-digital sampling converter, wherein it comprises:

a frequency multiplying circuit, which transforms the cyclic logic signal of frequency F into a cyclic logic signal of frequency 4F for the purpose of sampling the A-D converter at a rate of 2 samples per half-cycle of the sine wave signal, said samples being representative of sin $\emptyset$ and cos $\emptyset$, displaced by $\pi/2$;

a circuit for extracting from the sample supplied by the A-D converter absolute values of A sin $\emptyset$ and A cos $\emptyset$, A being the amplitude of the sine wave signal, as well as the signs of sin $\emptyset$ and cos $\emptyset$;

a circuit for calculating the absolute value of tan $\emptyset$ or cot $\emptyset$ on the basis of the absolute value of A sin $\emptyset$ and A cos $\emptyset$, as a function of whether A sin $\emptyset <$ A cos $\emptyset$ or A sin $\emptyset >$ A cos $\emptyset$, with the elimination of the amplitude A;

an accumulator which stores a plurality of data tan $\emptyset$ cot $\emptyset$ and restores a mean value therefrom;

a programmable read only memory receiving on its inputs digital data representing tan $\emptyset$ or cot $\emptyset$, from the operation performed either in tan $\emptyset$ or cot $\emptyset$, of the sign of cos $\emptyset$ and the sign of sin $\emptyset$, and which supplies at its outputs digital information representing the phase angle $\emptyset$.

2. A phase angle measuring device according to claim 1, wherein the A-D converter has two $2^n$ bits, the bits between $2^0$ and $2^{n-1}$ supplying a digital value representing sin $\emptyset$ and cos $\emptyset$ and the most significant bit $2^n$ supplying the sign of the sine and the cosine in the form of a logic 0 or a logic 1.

3. A device for measuring the phase angle between the sine wave signal and a cyclic logic signal of the same frequency with, on the input of the sine wave signal, an analog-digital sampling converter, wherein it comprises:

a frequency multiplying circuit, which transforms the cyclic logic signal of frequency F into a cyclic logic signal of frequency 4F for the purpose of sampling the A-D converter at a rate of 2 samples per half-cycle of the sine wave signal, said samples being representative of sin $\emptyset$ and cos $\emptyset$, displaced by $\pi/2$;

a circuit for extracting from the sample supplied by the A-D converter absolute values of A sin $\emptyset$ and A cos $\emptyset$, A being the amplitude of the sine wave signal, as well as the signs of sin $\emptyset$ and cos $\emptyset$;

a circuit for calculating the absolute value of tan $\emptyset$ or cot $\emptyset$ on the basis of the absolute value of A sin $\emptyset$ and A cos $\emptyset$, as a function of whether A sin $\emptyset <$ A cos $\emptyset$ or A sin $\emptyset >$ cos $\emptyset$, with the elimination of the amplitude A;

an accumulator which stores a plurality of data tan $\emptyset$ or cot $\emptyset$ and restores a mean value therefrom;

a programmable read only memory receiving on its inputs digital data representing tan $\emptyset$ or cot $\emptyset$, from the operation performed either in tan $\emptyset$ or cot $\emptyset$, of the sign of cos $\emptyset$ and the sign of sin $\emptyset$, and which supplies at its outputs digital information representing the phase angle $\emptyset$;

said A-D converter having two $2^n$ bits, the bits between $2^0$ and $2^{n-1}$ supplying a digital value representing sin $\emptyset$ and cos $\emptyset$ and the most significant bit $2^n$ supplying the sign of the sine and the cosine in the form of a logic 0 or a logic 1;

said circuit for extracting absolute values of A cos $\emptyset$ and A sin $\emptyset$ comprising:

a first register receiving at its input the digital values from the converter, as well as sampling data from a circuit for sampling signals corresponding to the measurement of sin $\emptyset$ and cos $\emptyset$ in the logic signal at frequency 4F, the register supplying at its output on the one hand the most significant digital value representing the sign of sin $\emptyset$ and cos $\emptyset$ and on the other digital measuring values;

a twos complements circuit for the digital values for which the sign a is negative, said circuit comprising an inverter followed by a ones complement adder and a switch controlled by the sign information from the register, the switch supplying at its output terminal the digital values from the register when the sine information is logic 1 and twos complement values when the sine information is a logic 0;

a second register receiving at its inputs the sign information from the first register, as well as the digital values from the switch and which supplies at its terminals the absolute value of $|A \sin \emptyset|$ in digital form as well as the sign; and a third register receiving at its inputs the sign informatioin from the first register, as well as digital values from the switch and supplying at its outputs the absolute value of $|A \cos \emptyset|$, in digital form, as well as the sign.

4. A device for measuring the phase angle between a sine wave signal and a cylic logic signal of the same frequency with, on the input of the sine wave signal, an analog-digital sampling converter, wherein it comprises:
- a frequency multiplying circuit, which transforms the cyclic logic signal of frequency F into a cyclic logic signal of frequency 4F for the purpose of sampling the A-D converter at a rate of 2 samples per half-cycle of the sine wave signal, said samples being representative of sin $\emptyset$ and cos $\emptyset$, displaced by $\pi/2$;
- a circuit for extracting from the sample supplied by the A-D converter absolute values of A sin $\emptyset$ and A cos $\emptyset$, A being the amplitude of the sine wave signal, as well as the signs of sin $\emptyset$ and cos $\emptyset$;
- a circuit for calculating the absolute value of tan $\emptyset$ or cot $\emptyset$ on the basis of the absolute value of A sin $\emptyset$ and A cos $\emptyset$, as a function of whether A sin $\emptyset$ < A cos $\emptyset$ or A sin $\emptyset$ > A cos $\emptyset$, with the elimination of the amplitude A;
- an accumulator which stores a plurality of data tan $\emptyset$ or cot $\emptyset$ and restores a mean value therefrom;
- a programmable read only memory receiving on its inputs digital data representing tan $\emptyset$ or cot $\emptyset$, from the operation performed either in tan $\emptyset$ or cot $\emptyset$, of the sign of cos $\emptyset$ and the sign of sin $\emptyset$, and which supplies at its outputs digital information representing the phase angle $\emptyset$;
- said A-D converter having two $2^n$ bits, the bits between $2^0$ and $2^{n-1}$ supplies a digital vaue representing sin $\emptyset$ and cos $\emptyset$ and the most significant but $2^n$ supplying the sign of the sine and the cosine in the form of a logic 0 or a logic 1;
- said circuit for calculating the absolute values of tan $\emptyset$ and $|\cot \emptyset|$ comprising:
  - a comparator receiving at its inputs the digital values representing $|A \sin \emptyset|$ and $|A \cos \emptyset|$, compares them and supplies at its output $|\tan \emptyset|$ or $|\cot \emptyset|$ calculation data;
  - a register having a plurality of flip-flops, each of said flip-flops receiving at a first input terminal the digital value of $|A \sin \emptyset|$ and at the second input terminal the digital value of $|A \cos \emptyset|$ and supplying at its output terminal either $|A \sin \emptyset|$ or $|A \cos \emptyset|$, as a function of the comparison data from the output of the comparator;
  - a programmable read only memory receiving at its input the data from the first output of the register and supplying at its output the reciprocal of said data;
  - a multiplying circuit receiving at a first input the values from the programmable read only memory ($1/|A \sin \emptyset|$ or $1/|A \cos \emptyset|$) and at a second input the values from a second output of the register ($|A \cos \emptyset|$ or $|A \sin \emptyset|$) and carries out the multiplication thereof in order to supply at its output either $|\tan \emptyset|$ or $|\cot \emptyset|$; and
  - an accumulator receiving the values from the multiplier and supplying at its output a mean value of $|\tan \emptyset|$ or $|\cot \emptyset|$.

* * * * *